United States Patent
Ichimaru

(10) Patent No.: US 6,639,475 B2
(45) Date of Patent: Oct. 28, 2003

(54) PLL CIRCUIT

(75) Inventor: Kouzou Ichimaru, Higashikunisaki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/107,629

(22) Filed: Mar. 27, 2002

(65) Prior Publication Data

US 2002/0153960 A1 Oct. 24, 2002

(30) Foreign Application Priority Data

Apr. 13, 2001 (JP) ........................................ 2001-115282

(51) Int. Cl.$^7$ ................................................ H03L 7/00
(52) U.S. Cl. ........................... 331/17; 331/25; 331/1 A; 327/156
(58) Field of Search ............................. 331/17, 25, 1 A

(56) References Cited

U.S. PATENT DOCUMENTS 4,857,866 A * 8/1989 Tateishi ...................... 331/1 A
6,114,920 A * 9/2000 Moon et al. ................... 33/17
6,342,818 B1 * 1/2002 Segawa et al. ............... 331/17

* cited by examiner

*Primary Examiner*—Terry D. Cunningham
*Assistant Examiner*—Long Nguyen
(74) *Attorney, Agent, or Firm*—William B. Kempler; W. James Brady, III; Frederick J. Telecky, Jr.

(57) ABSTRACT

A circuit for removing a spurious component contained in the output signal in the locked state of a PLL circuit in a fractional frequency division system. For frequency synthesizer 1 in this invention, there is a period in which the current sunk by charge pump circuit 35 and the current output from it are different from each other, and the ON start time of the upper operation transistor on the source side is different from that of the lower operation transistor on the sink side. Consequently, the output signal of charge pump circuit 35 is free of the error component generated in the prior art due to that fact that the ON start times of the upper operation transistor and lower operation transistor are close to each other and the operation transistor that turns ON earlier affects the other operation transistor. Consequently, when a compensating current from compensating circuit 37 is superimposed on the output signal, it is possible to eliminate the ripple current completely.

13 Claims, 4 Drawing Sheets

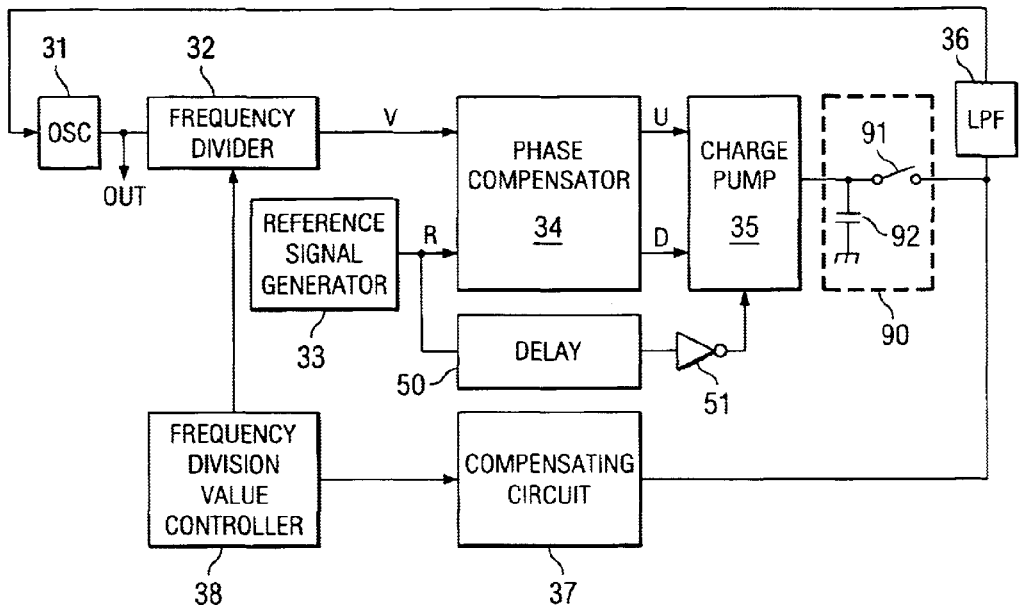
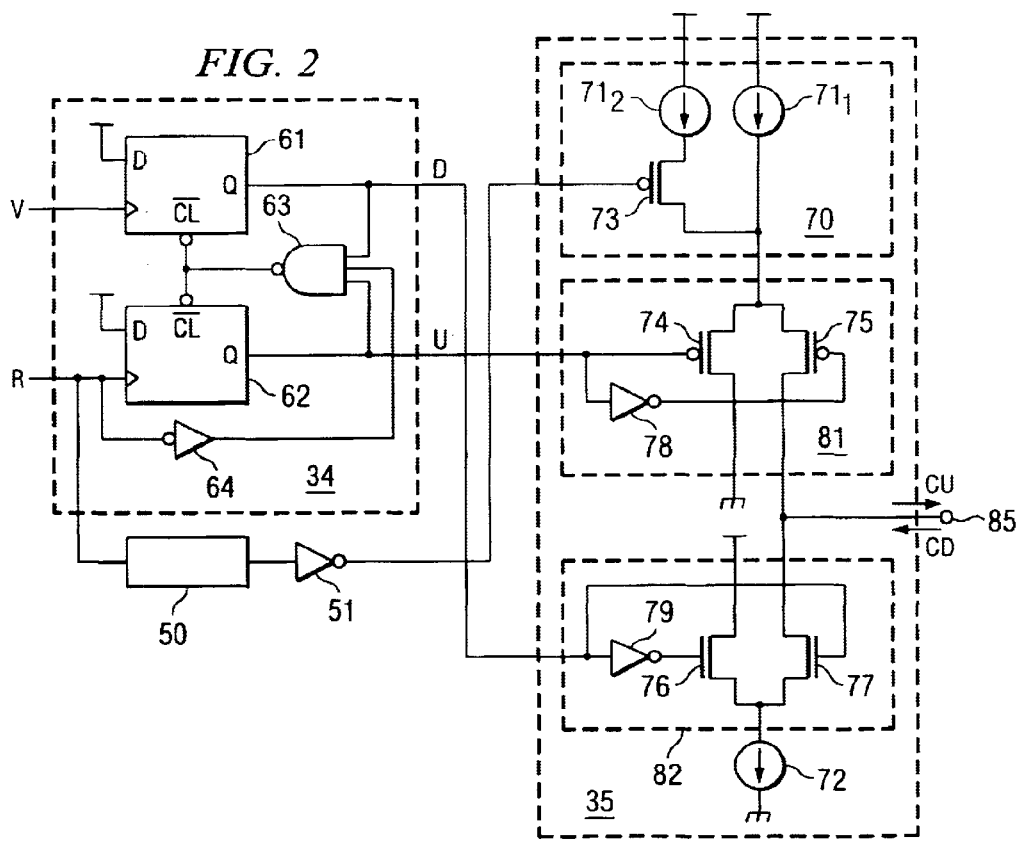

PLL CIRCUIT

FIELD OF THE INVENTION

This invention pertains to PLL (Phase-Locked Loop) technology. In particular, this invention pertains to a type of PLL circuit that can remove the ripple component from the output signal for the PLL circuit of a fractional frequency division system.

BACKGROUND OF THE INVENTION

A cellular phone is a multiple frequency channel access system. In order to shift the frequency in use to an idle channel, a PLL circuit that allows high-speed lockup is needed.

In FIG. 5, 101 represents a PLL circuit with a fractional frequency division system, prior art for the PLL circuit.

This PLL circuit 101 is placed in a semiconductor integrated circuit device that forms the transceiver of a cellular phone. It is composed of oscillator 131, frequency divider 132, reference signal generator 133, phase comparator 134, charge pump circuit 135, low-pass filter 136, controller 138 and compensating circuit 137.

Oscillator 131 generates an oscillation signal at a frequency corresponding to the signal output from low-pass filter 136, and outputs the oscillation signal to the output terminal. The oscillation signal is output as external output signal OUT to both frequency divider 132 and to the other circuits in the semiconductor integrated circuit device where PLL circuit 101 is arranged.

Frequency divider 132 performs frequency division for the oscillation signal input to it from oscillator 131, generates comparison signal V, and outputs it to phase comparator 134. Also, reference signal generator 133 outputs reference signal R at a prescribed frequency to phase comparator 134.

As illustrated by the timing chart shown in FIG. 6, phase comparator 134 rises in synchronization with the rise of comparative signal V and reference signal R, respectively, and, when reference signal R falls, it outputs output signals D and U in synchronization with the fall of reference signal R.

Output signals U and D of phase comparator 134 are output to charge pump circuit 135.

FIG. 9 is a diagram illustrating the constitution of charge pump circuit 135. This charge pump circuit 135 has output terminal 185, source-side constant current circuit 171, sink-side constant current pump circuit 172, source-side switch circuit 181, and sink-side switch circuit 182.

When phase comparator 134 outputs output signals U and D, respectively, output signals U and D are input to source-side switch circuit 181 and sink-side switch circuit 182, respectively.

Source-side switch circuit 181 and sink-side switch circuit 182 have upper and lower operation transistors 175 and 177, upper and lower stand-by transistors 174, 176, and inverters 178 and 179, respectively.

Stand-by transistors 174 and 176 and operation transistors 175 and 177 are all MOS transistors. Stand-by transistor 174 and operation transistor 175 that form source-side switch circuit 181 have their source terminals connected to each other. Similarly, stand-by transistor 176 and operation transistor 177 of sink-side switch circuit 182 are also connected to each other.

The common connection portions of stand-by transistors 174, 176 with operation transistors 175, 177 are respectively connected to source-side constant current circuit 171 and sink-side constant current circuit 172.

The gate terminal of upper stand-by transistor 174 and the gate terminal of lower operation transistor 177 are directly connected to the two output terminals of phase comparator 134, respectively, and output signals U and D are input as is. On the other hand, the gate terminal of upper operation transistor 175 and the gate terminal of lower stand-by transistor 176 are connected through inverters 178 and 179 to the two output terminals of phase comparator 134, respectively, and the inverted signals of output signals U and D are input. The constitution is such that for stand-by transistors 174, 176 and operation transistors 175, 177 of source-side switch circuit 181 and sink-side switch circuit 182, when one side is ON, the other side is OFF.

Suppose lower operation transistor 177 is ON, while upper operation transistor 175 is OFF. In this state, only sink-side constant current circuit 172 is connected to output terminal 185, and constant current CD generated by sink-side constant current circuit 172 (hereinafter referred to as sink-side constant current) is sunk at output terminal 185.

Suppose upper operation transistor 175 is ON, while lower operation transistor 177 is OFF. In this state, constant current CU generated by source-side constant current circuit 171 (hereinafter referred to as source-side constant current) is output from output terminal 185.

When output signals U and D are both in "L" state, "L" is input to the gate terminal of upper stand-by transistor 174, and "H" that is obtained by inversion using inverter 178 is input to the gate terminal of upper operation transistor 175. Because both upper operation transistor 175 and upper stand-by transistor 174 are P-channel MOS transistors, upper operation transistor 175 is OFF, while upper stand-by transistor 174 is ON, and constant current CU supplied by source-side constant current circuit 171 flows through upper stand-by transistor 174 to ground potential.

On the other hand, "H" that is obtained by inversion using inverter 179 is input to the gate terminal of lower stand-by transistor 176, and "L" is input to the gate terminal of lower operation transistor 177. Because both lower stand-by transistor 176 and lower operation transistor 177 are N-channel MOS transistors, lower operation transistor 177 is OFF, while lower stand-by transistor 176 is ON, and constant current CD supplied by sink-side constant current circuit 172 flows through lower stand-by transistor 176 at ground potential. Consequently, constant currents CU and CD do not flow at output terminal 185.

In this state, when output signals U and D are inverted from "L" to "H," stand-by transistors 174 and 176 are turned OFF, and, at the same time, operation transistors 175 and 177 are turned ON.

Output signals U and D rise independently in synchronization with the rise of reference signal R and comparison signal V of the preceding stage, respectively. When upper operation transistor 175 alone is ON, source-side constant current CU is output from output terminal 185, lower operation transistor 177 alone is ON, and sink-side constant current CD is sunk at output terminal 185. Also, because the magnitudes of the current supply of source-side constant current source 171 and sink-side constant current source 172 are equal to each other, and the current values of constant currents CU and CD are nearly equal to each other, when operation transistors 175 and 177 are ON at the same time, no current flows at output terminal 185.

Then, when reference signal R falls from "H" to "L," output signals D and U fall at the same time, so that operation transistors 175 and 177 are turned OFF at the same time, and, as shown in the timing chart of FIG. 6, the supply of constant currents CU and CD is always terminated at the same time $t_s$.

As explained above, after output signals U and D are converted from "L" to "H," respectively, during the period of conversion from "L" to "H," only one of constant currents CU and CD, output, respectively, from source-side constant current source 171 and sink-side constant current source 172, flows at the output terminal of charge pump circuit 135. This current is represented by SS in FIG. 6.

This current SS is output to low-pass filter 136. Low-pass filter 136 outputs said current SS to oscillator 131 after removing its high-frequency component.

The frequency of the oscillation signal of oscillator 131 is changed in correspondence with the voltage value output from low-pass filter 136. Said oscillator 131, frequency divider 132, reference signal generator 133, phase comparator 134, charge pump circuit 135, and low-pass filter 136 form a negative feedback loop. This negative feedback loop operates such that the phase difference becomes smaller, that is, the phase of comparison signal V comes into agreement with the phase of reference signal R. As a result, the frequency of external output signal OUT takes on the value obtained by multiplying the frequency of the reference signal by the frequency division value of frequency divider 132.

The frequency division value of said frequency divider 132 is controlled by controller 138, the frequency division value is changed periodically, and the frequency of external output signal OUT is locked at the value of the average frequency division value times the frequency of the reference signal.

For example, supposing the target frequency to be 1000025 kHz, if the reference signal has a frequency of 200 kHz, one may select the frequency division value for 7 periods (35 μsec) to be 5000, and the frequency division value for 1 period (5 μsec) to be 5001. In this case, the average frequency division value for the 8 periods is 5000.125 (=5000+⅛). In this case, the frequency of external output signal OUT is locked at the average frequency division value, that is, 5000.125 (=5000+⅛), times the frequency of the reference signal (200 kHz), that is, at the target frequency of 1000025 kHz.

In this way, if the average frequency division value is a value having this decimal part, it is possible to utilize high frequencies of 800 MHz, 1 GHz, etc. with narrow channel intervals of 25 kHz, 12.5 kHz, etc.

However, when the frequency division value is changed periodically as explained above, even after the external output signal OUT comes into agreement with the target frequency, the frequency division value of frequency divider 132 still varies periodically. Consequently, the phase of comparison signal V and the phase of reference signal R are not completely in agreement with each other, and a phase difference is generated. Due to this phase difference, the signal output from phase comparator 134 contains a ripple current that varies periodically.

The ripple current contained in the signal output from phase comparator 134 generates a spurious component in external output signal OUT, which not only degrades the reception characteristics of cellular phones and other communication equipment, but also interferes with communication. Consequently, this is a significant problem.

Compensating circuit 137 is arranged in said PLL circuit 101. The amount of charge of a prescribed ripple current is stored in compensating circuit 137 and, when a control signal is input from controller 138 to compensating circuit 137, at the input timing of this control signal, a charge that has the same magnitude as the amount of charge of the ripple current, yet has an opposite sign, is superimposed on the output signal of charge pump circuit 135, so that the ripple current can be canceled. As a result, control is achieved such that no spurious component is superimposed on external output signal OUT.

However, it is still impossible to remove the spurious component completely from external output signal OUT even when said compensating circuit 137 is used.

The present inventors of this invention performed research on the reasons for superimposition of the spurious component on external output signal OUT, and have found this reason.

FIGS. 7 and 8 illustrate the relationship between constant current CU output from charge pump circuit 135 and constant current CD sunk into it.

For said PLL circuit 101, because its frequency division value varies periodically, upper operation transistor 175 is ON for prescribed periods, and, as shown in FIGS. 7 and 8, ON start time $t_{177}$ of lower operation transistor 177 is earlier or later than ON start time $t_{175}$ of upper operation transistor 175. FIG. 7 illustrates the state when it is earlier, and FIG. 8 illustrates the state when it is later. In this way, due to fractional frequency division, one of operation transistors 175 and 177 turns ON earlier or later than the other one, yet such a deviation in ON start time is a miniscule one similar in degree to generation of the ripple current. As a result, the operation transistor that turns ON earlier affects ON of the operation transistor that turns ON later, and the operation for obtaining output signals D and U of phase comparator 134 is not performed. Consequently, the output signal of charge pump circuit 135 contains an error component other than the ripple current.

As a result, even when a compensating charge is superimposed by compensating circuit 137, it is still impossible to remove the error component. It has been found that because the error component results each time phase comparison is performed, it appears periodically in the output signal of charge pump circuit 135, and, as a result, a spurious component is superimposed.

A purpose of this invention is to solve the problems of the conventional methods by providing a technology that does not have a spurious component superimposed on the output signal of the PLL circuit.

SUMMARY OF THE INVENTION

In accordance with one aspect of, this invention, a PLL circuit comprises an oscillator that outputs an oscillation signal at a frequency corresponding to a control signal, a frequency divider of a fractional frequency division system that divides and outputs the oscillation signal, a reference signal generator that generates a reference signal, a phase comparator that compares the phase of the signal output from said frequency divider and that of the reference signal and outputs a first signal and a second signal corresponding to the phase difference, a charge pump circuit that has a first current supply circuit, which supplies to the output terminal a first current corresponding to the first signal, and a second current supply circuit, which supplies to the output terminal a second current corresponding to the second signal, a capacitive element that is connected to the output terminal of the charge pump circuit, a low-pass filter that takes the signal from the output terminal of the charge pump circuit as its input and supplies the control signal to the oscillator, a switch element that is connected between the output terminal of the charge pump circuit and the input terminal of the low-pass filter, and a compensating circuit that supplies a compensating current to the input terminal of the low-pass filter for removing the ripple component contained in the signal of the output terminal of the charge pump circuit; when the PLL circuit is in the locked state, supply of the first current and supply of the second current start at different times, and these supplies are stopped at the same time.

Also, for the PLL circuit in this invention, it is preferred that the switch element be in the OFF state when the first current or second current is supplied.

Also, the following aspect is preferred: the first current supply circuit has a first constant current source and a second constant current source, the second current supply circuit has a third constant current source, and current supply of the second constant current source starts after a prescribed time delay following the starting time of current supply by the first constant current source.

In addition, for one aspect of the PLL circuit in this invention, it is preferred that it have a controller that controls current supply of the second constant current source in correspondence with the reference signal.

Also, the following aspect is preferred: the phase comparator has a first logic circuit that takes the reference signal as its input and outputs the first signal, a second logic circuit that takes the output signal of the frequency divider as its input and outputs the second signal, and a third logic circuit that resets the first and second logic circuits in response to the reference signal; the first current supply circuit has a first transistor that connects the first constant current source to the output terminal in response to the first signal, and a second transistor that connects the second constant current source to the output terminal in response to the output signal of the controller; and the second current supply circuit has a third transistor that connects the third constant current source to the output terminal in response to the second signal.

In addition, in one aspect of the invention, it is preferred that the circuit have a frequency division value controller that controls the fractional frequency division value of the frequency divider and the compensating circuit.

According to another aspect of this invention, the current supply period is set such that, in the charge pump circuit arranged in the PLL circuit, the amount of charge per unit time supplied from the sink-side constant current circuit (second constant current supply circuit) to the control terminal and the amount of charge per unit time supplied from the source-side constant current circuit (first constant current supply circuit) to the output terminal have different magnitudes.

For example, supposing the source-side constant current circuit and sink-side constant current circuit are formed such that each of them has a constant current source and an operation transistor, and, when an operation transistor is ON, the corresponding constant current source is connected to the control terminal, and when it is OFF, the corresponding constant current source is turned OFF from the output terminal, we will look at the case when the operation transistors of both the source-side constant current circuit and the sink-side constant current circuit are OFF at the same time. In this case, when the frequency of the output signal of the oscillator is stable, the total amount of charge sourced by the source-side constant current circuit to the output terminal is equal to that sunk by the sink-side constant current circuit at the output terminal. However, because the operation transistors are OFF at the same time, if the amount of charge per unit time sourced by the source-side constant current circuit to the output terminal is different from that sunk by the sink-side constant current circuit during the current supply period, it is possible for the ON start times of the operation transistors to be different from each other. For operation transistors in the prior art, the transistor that turns ON earlier affects the operation of the transistor that turns ON later. However, by setting an appropriate deviation period, it can be arranged that the operation transistor that turns ON earlier will have no influence on the operation transistor that turns ON later. As a result, the error component due to the charge pump circuit is not contained in the output of the output terminal, and only the charge corresponding to the ripple current component is output from the output terminal. Consequently, by determining the amount of charge of the ripple current beforehand and by superimposing at the output terminal a charge with opposite sign to that of the ripple current, one can completely eliminate the ripple current.

Also, according to an aspect of this invention, the constitution is such that one or both of the source-side and sink-side constant current circuits has [or have] plural constant current sources, and it is possible to change the number of constant current sources connected to the output terminal. With this constitution, it is possible to change the amount of charge per unit time supplied to the output terminal during the current supply period. For example, assuming that the number of constant current sources connected to the output terminal is reduced during a certain period while it is increased during the remaining period, one can supply a smaller amount of charge to the output terminal during the control period, and supply a larger amount of charge after the deviation period. Conversely, one may also supply a larger amount of charge to the control terminal at first, and then supply a smaller amount of charge to the control terminal.

By having the switch element turned OFF during the period that charge flows from the output terminal, the charge supplied to the output terminal is used to charge the capacitive element instead of being directly input to the low-pass filter.

By turning on the switch element after charge is no longer supplied to the output terminal, the charge on the capacitive element is discharged, and is input to the low-pass filter. However, the accumulated charge becomes equal to the amount of charge of the ripple current component. As explained above, when a charge of sign opposite to that of the ripple current is superimposed at the input terminal of the low-pass filter, one can essentially completely eliminate the ripple current and have a zero ripple charge input to the low-pass filter.

BRIEF DESCRIPTION OF THE DRAWINGS

FIG. 1 is a block diagram illustrating the PLL circuit in this invention.

FIG. 2 is a circuit diagram illustrating the phase comparator and charge pump circuit in this invention.

REFERENCE NUMERALS AND SYMBOLS AS SHOWN IN THE DRAWINGS

Figure 3:
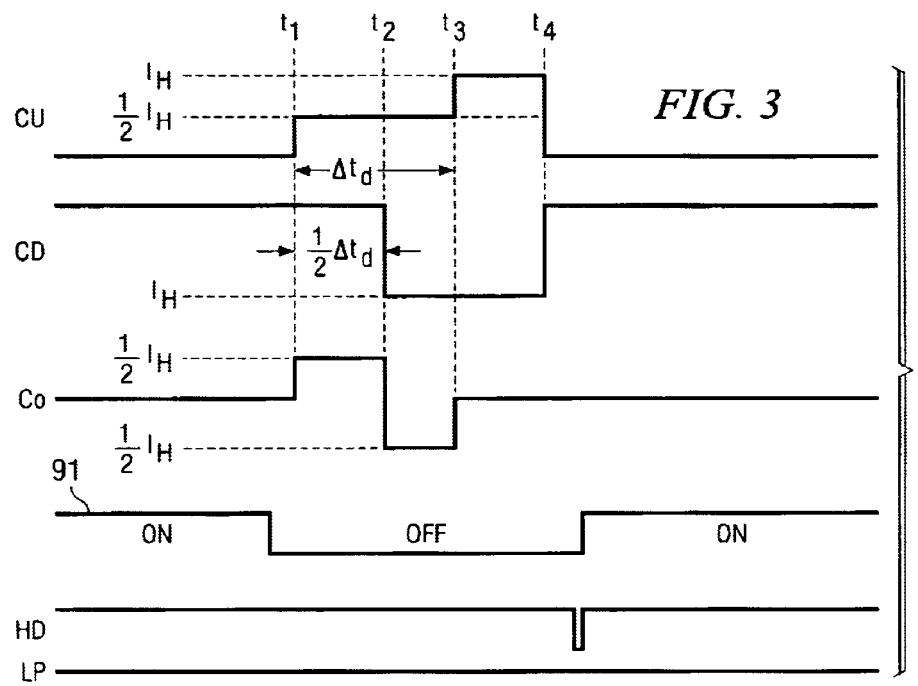
FIG. 3 is a timing chart illustrating the operation of the PLL circuit in an embodiment of this invention.

In the figures, 1 represents a PLL circuit, 31 an oscillator, 32 a frequency divider, 34 a phase comparator, 35 a charge pump circuit, 36 a low-pass filter, 37 a compensating circuit, 38 a frequency division value controller, 50 a delay circuit, 70 a source-side constant current circuit and 72 a sink-side constant current circuit.

DESCRIPTION OF THE EMBODIMENT

In the following, we will examine the embodiment of this invention with reference to figures.

In FIG. 1, 1 represents the PLL circuit of this invention.

This PLL circuit 1 is placed in a semiconductor integrated circuit device that forms the transceiver of a cellular phone. It is composed of oscillator 31, frequency divider 32, reference signal generator 33, phase comparator 34, charge pump circuit 35, low-pass filter 36, frequency division value controller 38, compensating circuit 37, delay circuit 50, inverter 51, and switch circuit 90.

Oscillator 31 generates an oscillation signal at a frequency corresponding to the signal output from low-pass filter 36, and outputs this signal from the output terminal to frequency divider 32 while at the same time outputting it as external output signal OUT to the other circuits in the semiconductor integrated circuit containing PLL circuit 1.

Frequency division value controller 38 has a constitution such that the frequency division value of frequency divider 32 is changed periodically. Frequency divider 32 performs frequency division of the oscillation signal input from oscillator 31 using a frequency division value that varies periodically, generates comparison signal V, and outputs it to phase comparator 34. Also, reference signal generator 33 outputs reference signal R at a prescribed frequency to phase comparator 34. As will be explained later, phase comparator 34 has a constitution such that it compares the phase of reference signal R with that of comparison signal V, and outputs an output signal corresponding to the phase difference to charge pump circuit 35. Charge pump circuit 35 has a constitution such that it outputs a current corresponding to the phase difference to the output terminal, as will be explained later. The output terminal of charge pump circuit 35 is connected to switch circuit 90. Switch circuit 90 has switch element 91 and capacitor 92. One end of switch element 91 is connected to the output terminal of charge pump circuit 35, and the other end is connected to the input terminal of low-pass filter 36. One end of capacitor 92 is connected to the output terminal of charge pump circuit 35, and the other end is connected to ground potential. When switch element 91 is turned OFF, the input terminal of low-pass filter 36 is turned OFF from the output terminal of charge pump circuit 35, and capacitor 92 is charged with the output current of charge pump circuit 35. When switch element 91 is turned ON, the output terminal of charge pump circuit 35 is connected to the input terminal of low-pass filter 36 of the subsequent stage, and the charge discharged from capacitor 92 is input to low-pass filter 36. Low-pass filter 36 removes the high-frequency component of the constant current output from charge pump circuit 35, and the current obtained is output to oscillator 31.

Oscillator 31 changes the frequency of the oscillation signal in correspondence with the voltage value output from low-pass filter 36. When switch element 91 is ON, and low-pass filter 36 remains connected to charge pump circuit 35, said oscillator 31, frequency divider 32, reference signal generator 33, phase comparator 34, charge pump circuit 35 and low-pass filter 36 form a negative feedback loop. This negative feedback loop controls the oscillation frequency of oscillator 31 in the direction corresponding with a decrease in the phase difference. As a result, the phase of comparison signal V comes into agreement with the phase of the reference signal. As a result, the frequency of external output signal OUT becomes the frequency of the reference signal times the average frequency division value of frequency divider 32.

Because the frequency division value of the fractional frequency divider varies periodically even in the locked state, charge (ripple current) is still output from charge pump circuit 35, and this charge causes the spurious component. The constitution is such that the amount of charge and the output timing of the charge are known beforehand, the amount of charge and timing are stored in compensating circuit 37, and compensating circuit 37 superimposes a compensating charge, equal in amount to that of charge to that of the stored ripple current but of opposite sign, on the output signal of charge pump circuit 35, so that the ripple current is canceled.

In order to use said compensating circuit 37 to cancel the charge that cannot be canceled in the prior art, charge pump circuit 35, delay circuit 50 and inverter 51 are arranged in PLL circuit 1 of this embodiment. In the following, we will examine details of this constitution.

FIG. 2 is a diagram illustrating in detail the constitution of phase comparator 34 and charge pump circuit 35 in said PLL circuit 1.

Phase comparator 34 has sink-side D latch circuit 61 and source-side D latch circuit 62. Said sink-side D latch circuit 61 and source-side D latch circuit 62 have their input terminals connected to frequency divider 32 and reference signal generator 33 of the preceding stage, respectively. Their output terminals are connected to charge pump circuit 35. When comparison signal V and reference signal R are input to these input terminals, respectively, output signals D and U are output to charge pump circuit 35 from the output terminals of sink-side D latch circuit 61 and source-side D latch circuit 62, respectively.

Charge pump circuit 35 has control terminal 85, source-side constant current circuit 70, source-side switch circuit 81, sink-side constant current circuit 72 and sink-side switch circuit 82, as shown in FIG. 2. Source-side switch circuit 81 has upper operation transistor 75, upper stand-by transistor 74, and inverter 78. On the other hand, sink-side switch circuit 82 has lower operation transistor 77, lower stand-by transistor 76, and inverter 79. Stand-by transistors 74, 76 and operation transistors 75, 77 are all MOS transistors. The source terminals of upper stand-by transistor 74 and upper operation transistor 75 are connected to each other. Similarly, the source terminals of lower stand-by transistor 76 and lower operation transistor 77 are also connected to each other. The common connection portions of stand-by transistors 74, 76 with operation transistors 75, 77 are respectively connected to source-side constant-current circuit 70 and sink-side constant-current circuit 72.

The gate terminals of upper stand-by transistor 74 and lower operation transistor 77 are directly connected to the output terminals of source-side D latch circuit 62 and sink-side D latch circuit 61, respectively, and output signals U and D are input as is. On the other hand, the gate terminal of upper operation transistor 75 and the gate terminal of lower stand-by transistor 76 are connected through inverters 78, 79 to the output terminals of source-side D latch circuit 62 and sink-side D latch circuit 61, respectively, and the inverted signals of output signals U and D are input. The constitution is such that, for stand-by transistors 74, 76 and operation transistors 75, 77, when one side is ON, the other side is OFF.

In the state in which lower operation transistor 77 is ON while upper operation transistor 75 is OFF, only sink-side constant current circuit 72 is connected to control terminal 85, and constant current CD generated by sink-side constant current circuit 72 (hereinafter referred to as sink-side constant current) is sunk at control terminal 85.

In the state in which upper operation transistor 75 is ON, while lower operation transistor 77 is OFF, constant current CU generated by source-side constant current circuit 70 (hereinafter referred to as source-side constant current) is output from control terminal 85.

Source-side constant current circuit 70 has two constant current sources $71_1$ and $71_2$ and switch transistor 73. One constant current source $71_1$ is directly connected to source-side switch circuit 81, and the other constant current source $71_2$ is connected via switch transistor 73 to source-side switch circuit 81. Consequently, in the state in which upper operation transistor 75 and switch transistor 73 are ON, both constant current sources $71_1$ and $71_2$ are connected to control terminal 85, and the constant currents generated by both of them are supplied to control terminal 85. When switch transistor 73 is turned off, only constant current source $71_1$ is connected, via upper operation transistor 75 that has been turned ON, to control terminal 85, and only the constant current generated by one constant current source $71_1$ is supplied to control terminal 85.

Also, in the state in which both operation transistors 75 and 77 are ON, both source-side constant current circuit 70 and sink-side constant current circuit 72 are connected to control terminal 85, and the difference between source-side constant current CU and sink-side constant current CD is supplied to control terminal 85.

In the following, we will look at the operation of the circuit. When both comparison signal V and reference signal R are in "L" state, "L" output signals D and U are output from sink-side D latch circuit 61 and source-side D latch circuit 62, respectively.

Transistors 74, 75 and transistors 76, 77 are, respectively, P-channel MOS transistors and N-channel MOS transistors. When "H" and "L" are input to the gate terminals of operation transistors 75 and 77, respectively, both transistors are turned OFF, and, because "L" and "H" are input to the gate terminals of stand-by transistors 74 and 76, respectively, both stand-by transistors are turned ON.

In this way, when both comparison signal V and reference signal R are in "L" state, operation transistors 75 and 77 are turned OFF, and stand-by transistors 74 and 76 are turned ON, so that constant currents CU and CD do not flow at control terminal 85.

When comparison signal V and reference signal R are inverted from the "L" to the "H" state, output signals D and U are converted from "L" to "H" in synchronization with comparison signal V and reference signal R, respectively, stand-by transistors 74 and 76 are turned OFF, and, at the same time, operation transistors 75 and 77 are turned ON, so that source-side constant current circuit 70 and sink-side constant current circuit 72 are connected to control terminal 85, respectively.

Delay circuit 50 delays reference signal R for a prescribed delay time and then outputs it to inverter 51. Inverter 51 inverts the output signal of delay circuit 50 and outputs it to the gate terminal of switch transistor 73.

As reference signal R is inverted from "L" to "H," upper operation transistor 75 turns ON at the same time that reference signal R becomes "H." However, during the period of the prescribed delay time following inversion of reference signal R from "L" to "H," the output of delay circuit 50 is "L," and this "L" signal is inverted to "H" by inverter 51 and is then input to the gate terminal of switch transistor 73. Consequently, for switch transistor 73 that is a P-channel MOS transistor, when "H" is input to its gate terminal, switch transistor 73 remains OFF without being turned ON. As a result, in source-side constant current circuit 70, only one constant current source $71_1$ is connected to terminal 85 through upper operation transistor 75 that has been turned ON, and the constant current generated by one constant current source $71_1$ is fed to control terminal 85.

After the prescribed delay time, the output of delay circuit 50 becomes "H," and this "H" signal is inverted to "L" by inverter 51 and is input to the gate terminal of switch transistor 73, so that switch transistor 73 turns ON, two constant current sources $71_1$ and $71_2$ are connected through operation transistor 75 to control terminal 85, and the constant currents supplied by two constant current sources $71_1$ and $71_2$ are fed to control terminal 85.

In this way, in source-side constant current circuit 70, at first only the constant current generated by one constant current source $71_1$ is fed to control terminal 85. Then, the constant currents generated by both constant current sources $71_1$ and $71_2$ are fed to control terminal 85. The current waveform is represented by CU in the timing chart shown in FIG. 3.

On the other hand, during the period when operation transistor 77 is ON, sink-side constant current circuit 72 is connected through lower operation transistor 77 to control terminal 85.

Then, comparison signal V and reference signal R are inverted from "H" to "L." Comparison signal V and reference signal R are input to sink-side D latch circuit 61 and source-side D latch circuit 62, respectively. However, because the D-terminals of D latch circuits 61 and 62 are both fixed at "H," the output signals D and U of D latch circuits 61 and 62 are kept in "H" state without inverting to "L" only when both comparison signal V and reference signal R are inverted to "L."

Phase comparator 34 has 3-input NAND circuit 63 and inverter 64. The output signals of sink-side D latch circuit 61 and source-side D latch circuit 62, as well as reference signal R that has been inverted by inverter 64 are input to NAND circuit 63.

When comparison signal V and reference signal R are inverted from "H" to "L," "H" is input from D latch circuits 61 and 62 to two input terminals among the three input terminals of NAND circuit 63. When reference signal R is inverted from "H" to "L" in this state, reference signal R is inverted to "H" by inverter 64 and is input to the input terminal of NAND circuit 63, and "H" signal is input to all of the three input terminals of NAND circuit 63. As a result, the output of NAND circuit 63 becomes "L," and the L-level signal is output to the active-low clear terminals of sink-side D latch circuit 61 and source-side D latch circuit 62, D latch circuits 61 and 62 are reset, and their output signals are inverted to "L" at the same time.

As explained above, output signals D and U rise from "L" to "H" in correspondence with the rise of comparison signal V and reference signal R, respectively. On the other hand, they fall from "H" to "L" at the same time in synchronization with the rise of reference signal R.

Because output signals D and U of D latch circuits 61 and 62 are inverted from "H" to "L" simultaneously, operation transistors 75 and 77 that have been ON are turned OFF, and, at the same time, stand-by transistors 74 and 76 that have been OFF are turned ON, so that constant currents CU and CD generated by source-side constant current circuit 70 and sink-side constant current circuit 72 are not fed to control terminal 85. As explained above, because output signals D and U of D latch circuits 61 and 62 fall at the same time, constant currents CU and CD are not fed at the same time.

In the state in which the negative feedback loop is locked, the output frequency of oscillator 31 is constant, and, in this case, a constant voltage is input to oscillator 31. In this state, only the minute ripple current that can be removed from charge pump circuit 35 by low-pass filter 36 is output, and, if the ripple current is removed, the output of charge pump circuit 35 becomes 0. Consequently, the amount of charge due to sink-side constant current CD and the amount of charge due to source-side constant current CU are equal to each other after removal of the ripple current.

FIG. 3 is a timing chart illustrating the state of constant currents CU, CD in this case. In the figure, $I_H$ represents the current value of constant current CD generated by sink-side constant current circuit 72.

The current values of source-side constant current CU generated by two constant current sources $71_1$ and $71_2$ of source-side constant current circuit 70 are equal to each other, and they achieve half the current value $I_H$ of sink-side constant current CD.

Consequently, during the period of delay time $\Delta t_d$ following start time $t_1$ of ON of upper operation transistor 75, source-side constant current CU has half the current value $I_H$ of sink-side constant current CD, (½)$I_H$. During the period between time $t_3$ when switch transistor 73 turns ON after delay time $\Delta t_d$ to time $t_4$ of the end of the ON state, the current has current value $I_H$ that is equal to constant current CD.

In the state in which the feedback loop is locked, the amount of charge of source-side constant current CU and the amount of charge of sink-side constant current CD output during the ON period of operation transistors 75 and 77 are equal to each other after the ripple current component is removed.

As explained above, because operation transistors 75 and 77 are turned OFF at the same time, and the ON periods of operation transistors 75 and 77 terminate at the same time as time $t_4$, the current amount is small in the initial stage of the ON period, and the ON start time $t_1$ of upper operation transistor 75 is earlier than the ON start time $t_2$ of lower operation transistor 77.

In particular, after switch transistor 73 turns ON, the current value fed from source-side constant current circuit 70 and the current value sunk by sink-side constant current circuit 72 are equal to each other, and the amounts of charge after ON start time $t_3$ of switch transistor 73 are equal to each other. On the other hand, as explained above, only during delay period $\Delta t_d$ before switch transistor 73 turns ON, the feed current of source-side constant current circuit 70 is half the current sunk by sink-side constant current circuit 72. Consequently, the amounts of charge are also equal to each other even before the ON start time $t_3$ of switch transistor 73. Consequently, lower operation transistor 77 turns ON after a delay of half delay time $\Delta t_d$ with respect to upper operation transistor 75.

In this embodiment, at least while the feedback loop is locked, the magnitude of the feed current of one constant current circuit is different from that of the feed current of the other constant current circuit during a prescribed period, such as delay time $\Delta t_d$ in the example. By setting an appropriate period when the amounts of charge are different from each other after both operation transistors 75 and 77, which connect source-side constant current circuit 70 and sink-side constant current circuit 72 to control terminal 85, are turned OFF, it is possible to make the ON start times $t_1$ and $t_2$ of the two operation transistors 75 and 77 different from each other. As will be explained later, it is possible to set this delay time $\Delta t_d$ to be the entire ON period of one operation transistor.

In the prior art, when the feedback loop is locked, the ON start times of operation transistors 175 and 177 are rather close to each other, and whichever of operation transistors 175 and 177 that turns ON earlier affects the operation of the other operation transistor that turns ON later. On the other hand, in this embodiment, as explained above, ON start times $t_1$ and $t_2$ of operation transistors 75 and 77 deviate from each other by half the delay time $\Delta t_d$ ½ $\Delta t_d$. By setting an appropriate delay time $\Delta t_d$, whichever of operation transistors 75 and 77 that turns ON earlier does not affect the operation transistor that turns ON later.

As a result, operation transistors 75 and 77 perform the operation for obtaining output signals U and D of phase comparator 34, and the error component due to charge pump circuit 35 that arises in the prior art does not appear in the output of charge pump circuit 35. Consequently, when a compensating charge from compensating circuit 37 is superimposed on the output of charge pump circuit 35, it is possible to completely cancel the ripple component.

However, as explained above, lower operation transistor 77 turns ON with a delay of half the delay time $\Delta t_d$ with respect to upper operation transistor 75. Due to this delay, a current larger than the ripple current is output from control terminal 85 of charge pump circuit 35. The waveform of the current output from control terminal 85 of the charge pump circuit is shown as $C_O$ in FIG. 3.

As illustrated by waveform $C_O$ in FIG. 3, during the period from ON start time $t_1$ of upper operation transistor 75 to ON start time $t_2$ of lower operation transistor 77, source-side constant current CU with a current value of (½)$I_H$ is output from control terminal 85. In the period from ON start time $t_2$ of lower operation transistor 77 to ON time $t_3$ Of switch transistor 73, sink-side constant current CD with current value of (½)$I_H$ is sunk at control terminal 85.

Because the current with waveform $C_O$ shown in FIG. 3 is output from control terminal 85 periodically each time that phase comparison is performed, and control terminal 85 of charge pump circuit 35 is kept connected to the input terminal of low-pass filter 36, the current is input as is to low-pass filter 36, and a spurious component is contained in external output signal OUT.

Consequently, said PLL circuit 1 has switch circuit 90 equipped with switch element 91 and capacitor 92, and the constitution is such that when switch element 91 is turned OFF, the output current of charge pump circuit 35 is directly input to capacitor 92, and when the switch element is turned ON, the output current of charge pump circuit 35 is input directly to low-pass filter 36.

As shown in FIG. 3, switch element 91 is turned OFF before ON start time $t_1$ of upper operation transistor 75 that turns ON earlier. Then, control terminal 85 of the charge pump circuit is cut off from low-pass filter 36, and capacitor 92 is charged by the output current of the charge pump circuit.

Then, operation transistors 75 and 77 are turned ON, and after time $t_4$ when both ON periods are terminated at the same time, switch element 91 is turned ON. Then, low-pass filter 36 and capacitor 92 are connected to each other, and the charge on capacitor 92 is discharged. The charge that accumulates on capacitor 92 during the OFF period of switch element 91 is equal to the ripple current. When the compensating current, represented by HD in FIG. 3, is output from compensating circuit 37 and superimposed, the charge input to low-pass filter 36 becomes 0. In FIG. 3, LP represents the waveform of the voltage input to low-pass filter 36.

As explained above, the input voltage LP to low-pass filter 36 in the locked state becomes 0 V by means of PLL circuit 1 in this embodiment. Consequently, the spurious component that cannot be removed in the prior art can be removed completely from external output signal OUT.

In the embodiment, during the period of delay time $\Delta t_d$ after the start of ON of upper operation transistor 75, source-side constant current circuit 70 supplies a current value of ½ the current value generated by sink-side constant current circuit 72. However, the current value generated by source-side constant current circuit 70 during this period is not limited to this value. For example, the constitution may be such that the current value becomes ⅓ the current value generated by sink-side constant current circuit 72.

Also, during the period from the end of delay time $\Delta t_d$ to the end of the ON periods of operation transistors 75 and 77, the current values of constant current circuits 70 and 72 become equal to each other. However, the current value fed by source-side constant current circuit 70 may be equal to the current value generated by sink-side constant current circuit 72 or, for example, smaller than the current value generated by sink-side constant current circuit 72.

Also, source-side constant current circuit 70 has a constitution such that after a relatively small current is fed, a current larger than the initial current value is fed. However, it is also possible to have a constitution such that after a relatively large current is fed, a current with a smaller value than the initial current is fed.

Figure 4:
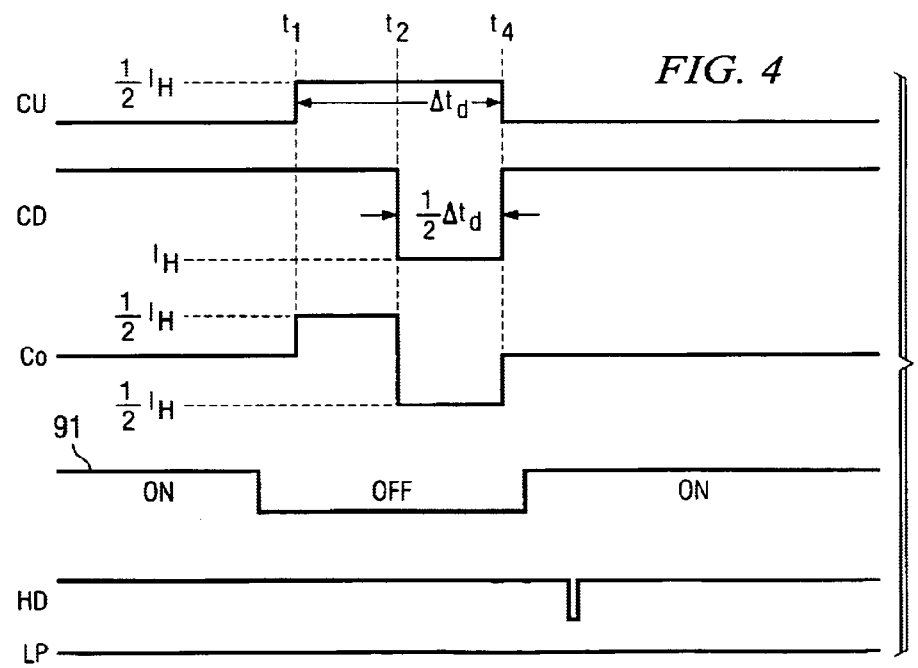
FIG. 4 is a timing chart illustrating the operation of the PLL circuit in another embodiment of this invention.
Figure 5:
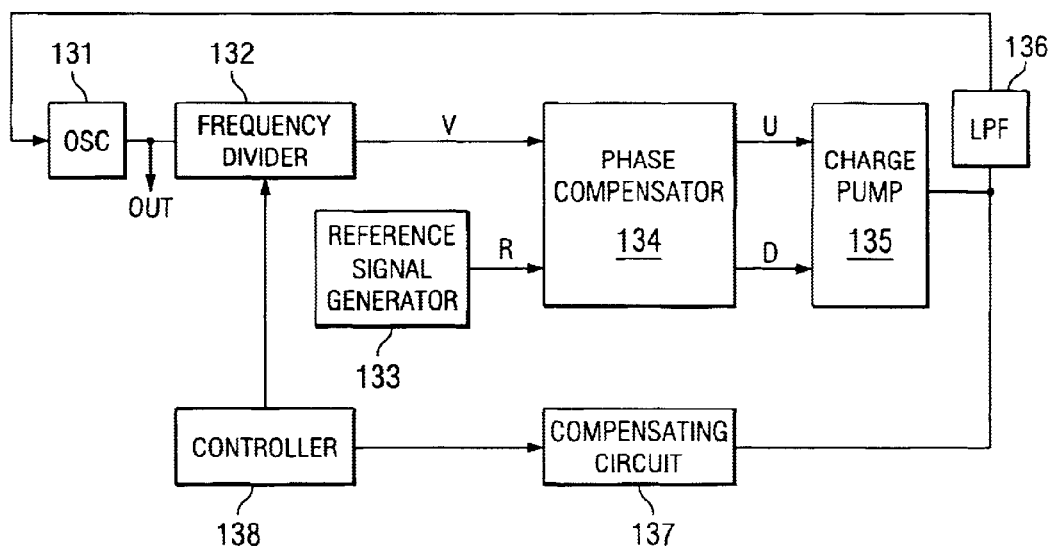
FIG. 5 is a block diagram illustrating a conventional PLL circuit.
Figure 6:
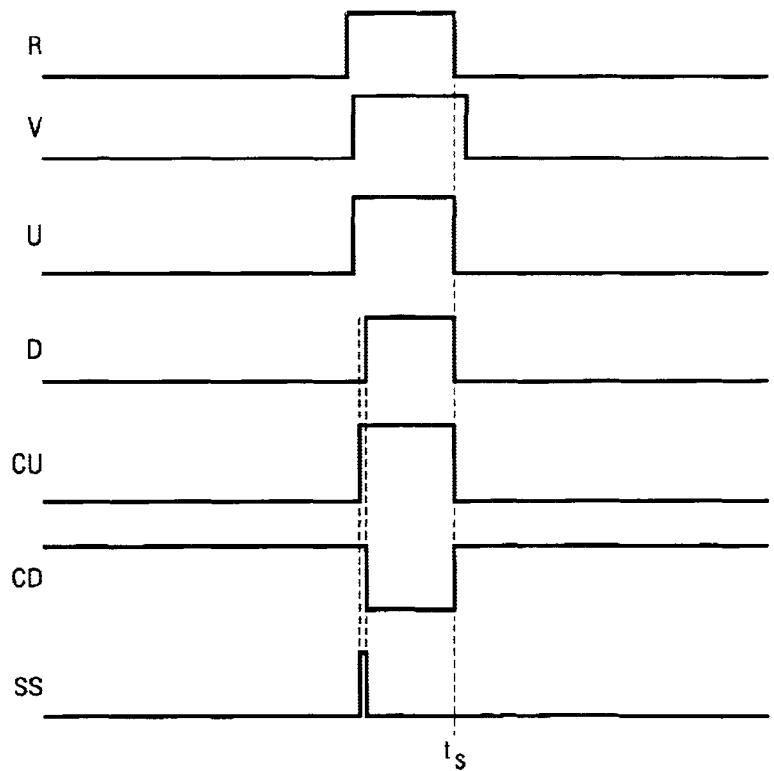
FIG. 6 is a timing chart illustrating the operation of the conventional PLL circuit.
Figure 7:
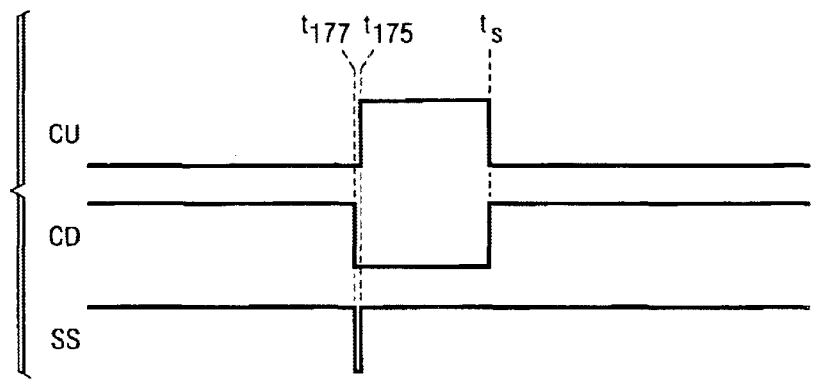
FIG. 7 is a first diagram illustrating the operation of the operation transistors in the charge pump circuit used in the conventional PLL circuit.
Figure 8:
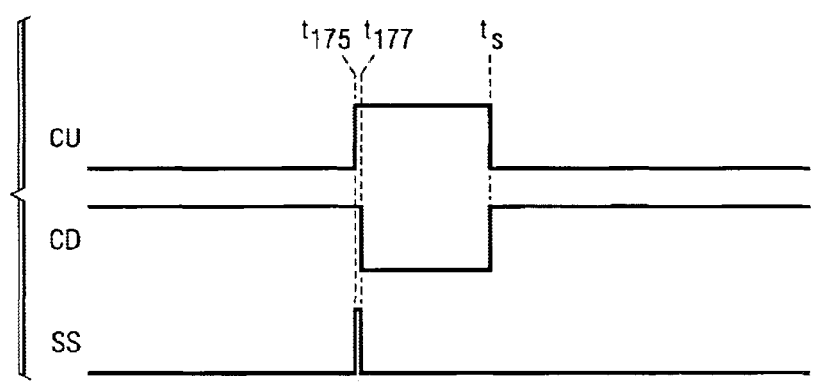
FIG. 8 is a second diagram illustrating the operation of the operation transistors in the charge pump circuit used in the conventional PLL circuit.
Figure 9:
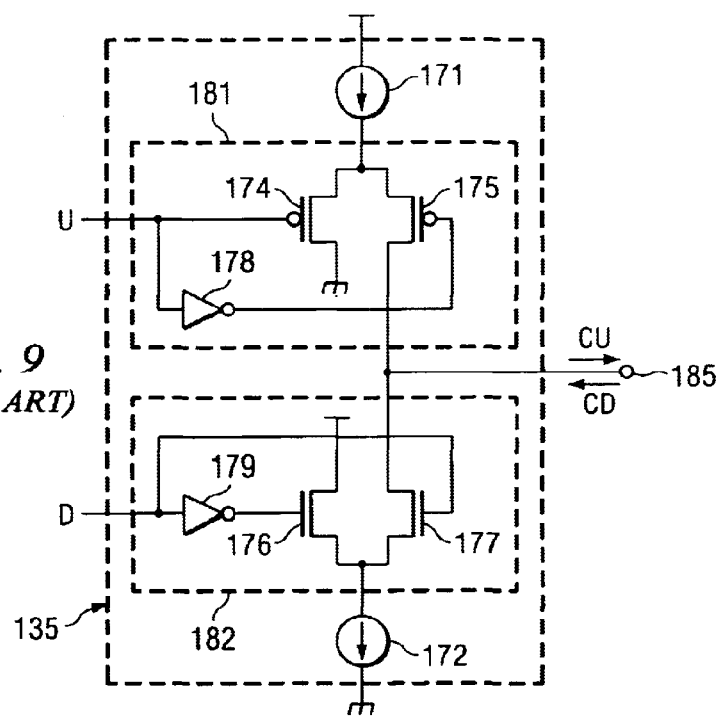
FIG. 9 is a diagram illustrating the charge pump circuit used in the conventional PLL circuit.

Also, as explained above, the constitution may also be such that delay time $\Delta t_d$ is set to be the total ON period of one operation transistor. FIG. 4 is a timing chart illustrating the operation when delay time $\Delta t_d$ is set to be the total ON period of upper operation transistor 75. In this case, the current value of source-side constant current CU is always half the current value $I_H$ of sink-side constant current CD, that is, (½)$I_H$, and the ON period of lower operation transistor 77 becomes half the ON period of upper operation transistor 75, that is, the delay time $\Delta t_d$.

In the embodiment, source-side constant current circuit 70 has a constitution such that source-side constant current CU is changed. However, it is also possible to adopt a constitution in which sink-side constant current circuit 72 changes the current value of sink-side constant current CD. It is possible to eliminate the error component due to the charge pump circuit, and it is possible to cancel the ripple current correctly.

What is claimed is:

1. A PLL circuit comprising
   an oscillator that outputs an oscillation signal at a frequency corresponding to a control signal,
   a frequency divider of a fractional frequency division system that divides and outputs the oscillation signal,
   a reference signal generator that generates a reference signal,
   a phase comparator that compares the phase of the signal output from said frequency divider and that of the reference signal and outputs a first signal and a second signal corresponding to the phase difference,
   a charge pump circuit that has a first current supply circuit, which supplies to the output terminal a first current corresponding to the first signal, and a second current supply circuit, which supplies to the output terminal a second current corresponding to the second signal,
   a capacitive element that is connected to the output terminal of the charge pump circuit,
   a low-pass filter that takes the signal from the output terminal of the charge pump circuit as its input and supplies the control signal to the oscillator,
   a switch element that is connected between the output terminal of the charge pump circuit and the input terminal of the low-pass filter,
   and a compensating circuit that supplies a compensating current to the input terminal of the low-pass filter for removing the ripple component contained in the signal of the output terminal of the charge pump circuit;
   whereby, when the PLL circuit is in the locked state, supply of the first current and supply of the second current start at different times, and these supplies are stopped at the same time.

2. The PLL circuit described in claim 1 wherein the switch element is in the OFF state when the first current or second current is supplied.

3. The PLL circuit described in claim 1 wherein the first current supply circuit has a first constant current source and a second constant current source, the second current supply circuit has a third constant current source, and current supplied by the second constant current source starts after a prescribed time delay following the starting time of current supplied by the first constant current source.

4. The PLL circuit described in claim 3 further comprising a controller that controls current supply by the second constant current source in correspondence with the reference signal.

5. The PLL circuit described in claim 4 wherein:
   the phase comparator has a first logic circuit that takes the reference signal as its input and outputs the first signal, a second logic circuit that takes the output signal of the frequency divider as its input and outputs the second signal, and a third logic circuit that resets the first and second logic circuits in response to the reference signal;
   the first current supply circuit has a first transistor that connects the first constant current source to the output terminal in response to the first signal, and a second transistor that connects the second constant current source to the output terminal in response to the output signal of the controller; and
   the second current supply circuit has a third transistor that connects the third constant current source to the output terminal in response to the second signal.

6. The PLL circuit described in claim 1, further comprising a frequency division value controller circuit that controls the fractional frequency division value of the frequency divider and the compensating circuit.

7. The PLL circuit described in claim 2 wherein first current supply circuit has a first constant current source and a second constant current source, the second current supply circuit has a third constant current source, and current supplied by the second constant current source starts after a prescribed time delay following the starting time of current supplied by the first constant current source.

8. The PLL circuit described in claim 7 further comprising a controller that controls current supply by the second constant current source in correspondence with the reference signal.

9. The PLL circuit described in claim 8 wherein:

the phase comparator has a first logic circuit that takes the reference signal as its input and outputs the first signal, a second logic circuit that takes the output signal of the frequency divider as its input and outputs the second signal, and a third logic circuit that resets the first and second logic circuits in response to the reference signal;

the first current supply circuit has a first transistor that connects the first constant current source to the output terminal in response to the first signal, and a second transistor that connects the second constant current source to the output terminal in response to the output signal of the controller; and the second current supply circuit has a third transistor that connects the third constant current source to the output terminal in response to the second signal.

10. The PLL circuit described in claim 2, further comprising a frequency division value controller circuit that controls the fractional frequency division value of the frequency divider and the compensating circuit.

11. The PLL circuit described in claim 3, further comprising a frequency division value controller circuit that controls the fractional frequency division value of the frequency divider and the compensating circuit.

12. The PLL circuit described in claim 4, further comprising a frequency division value controller circuit that controls the fractional frequency division value of the frequency divider and the compensating circuit.

13. The PLL circuit described in claim 5, further comprising a frequency division value controller circuit that controls the fractional frequency division value of the frequency divider and the compensating circuit.

* * * * *